United States Patent
Li et al.

(10) Patent No.: US 11,231,652 B2
(45) Date of Patent: Jan. 25, 2022

(54) LIQUID CHEMICAL VAPOR RECOVERY DEVICE, WET STRIPPING DEVICE, PHOTORESIST STRIPPING PROCESS, AND METHOD FOR MANUFACTURING THIN FILM TRANSISTOR-LIQUID CRYSTAL DISPLAY USING THE SAME

(71) Applicants: BOE Technology Group Co., Ltd., Beijing (CN); HEFEI XINSHENG OPTOELECTRONICS TECHNOLOGY CO., LTD., Anhui (CN)

(72) Inventors: Qianqian Li, Beijing (CN); Shikai Wang, Beijing (CN); Dongseob Kim, Beijing (CN); Jun Geng, Beijing (CN); Yadong Liang, Beijing (CN); Xiaoning Liu, Beijing (CN); Mingming Wang, Beijing (CN); Hao Yin, Beijing (CN); Yadong Xu, Beijing (CN); Zhongren Jiang, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei (CN)

( * ) Notice: Subject to any disclaimer, the term of this patent is extended or adjusted under 35 U.S.C. 154(b) by 434 days.

(21) Appl. No.: 15/952,574

(22) Filed: Apr. 13, 2018

(65) Prior Publication Data

US 2019/0064674 A1    Feb. 28, 2019

(30) Foreign Application Priority Data

Aug. 25, 2017 (CN) .......................... 201721086482.2

(51) Int. Cl.
*H01L 21/027* (2006.01)
*H01L 21/67* (2006.01)
(Continued)

(52) U.S. Cl.
CPC ................ *G03F 7/422* (2013.01); *B08B 3/08* (2013.01); *B08B 3/10* (2013.01); *G03F 7/0007* (2013.01);
(Continued)

(58) Field of Classification Search
CPC ........... H01L 21/67017; H01L 21/6715; H01L 21/67207; H01L 21/6708; B65D 90/30;
(Continued)

(56) References Cited

U.S. PATENT DOCUMENTS 3,245,883 A * 4/1966 Loebel .................... C02F 1/045
   203/7
3,394,530 A * 7/1968 O'Neill ............. B01D 17/0208
   96/159

(Continued)

*Primary Examiner* — Keath T Chen
*Assistant Examiner* — Margaret D Klunk
(74) *Attorney, Agent, or Firm* — Westman, Champlin & Koehler, P.A.

(57) ABSTRACT

Disclosed is a liquid chemical vapor recovery device, a wet stripping device, a photoresist stripping process and a method for manufacturing a thin film transistor-liquid crystal display using the same. The liquid chemical vapor recovery device comprises: an exhaust pipe for discharging a gas in a processing chamber for wet processing with a liquid chemical, the gas comprising a vapor of the liquid chemical; and a reflux pipe for refluxing the liquid chemical condensed in the exhaust pipe to a liquid chemical storage tank, the reflux pipe having an inlet connected to the exhaust pipe and an outlet connected to the liquid chemical storage tank, wherein, at least a part of the exhaust pipe positioned upstream of the inlet of the reflux pipe is formed as a pipe segment with a rugged inner surface.

13 Claims, 1 Drawing Sheet

(51) Int. Cl.
*G03F 7/42* (2006.01)
*G03F 7/00* (2006.01)
*B08B 3/10* (2006.01)
*H01L 27/12* (2006.01)
*B08B 3/08* (2006.01)
*G02F 1/1368* (2006.01)
*B01D 5/00* (2006.01)
*B01D 53/00* (2006.01)

(52) U.S. Cl.
CPC .... *H01L 21/0273* (2013.01); *H01L 21/67017* (2013.01); *H01L 21/67207* (2013.01); *H01L 27/1288* (2013.01); *B01D 5/0009* (2013.01); *B01D 5/0012* (2013.01); *B01D 53/002* (2013.01); *G02F 1/1368* (2013.01); *H01L 21/6715* (2013.01)

(58) Field of Classification Search
CPC .... B01D 53/002; B01D 5/0015; B01D 5/002; B01D 5/30; B01D 5/0012; B01D 5/0006; B01D 5/0009
See application file for complete search history.

(56) References Cited

U.S. PATENT DOCUMENTS

| | | | | |
|---|---|---|---|---|
| 3,761,228 | A | * | 9/1973 | Kaartinen ............... C01B 5/02 436/57 |
| 4,658,890 | A | * | 4/1987 | Uehara .................. F28B 1/04 165/110 |
| 5,779,927 | A | * | 7/1998 | Lo ....................... B24B 37/013 156/345.15 |
| 2004/0011463 | A1 | * | 1/2004 | Nakagawa ........ H01L 21/67207 156/345.18 |
| 2005/0150648 | A1 | * | 7/2005 | Dilley .................... F28F 1/42 165/184 |
| 2015/0314418 | A1 | * | 11/2015 | Shinozaki ............ B24B 37/34 156/345.12 |

* cited by examiner

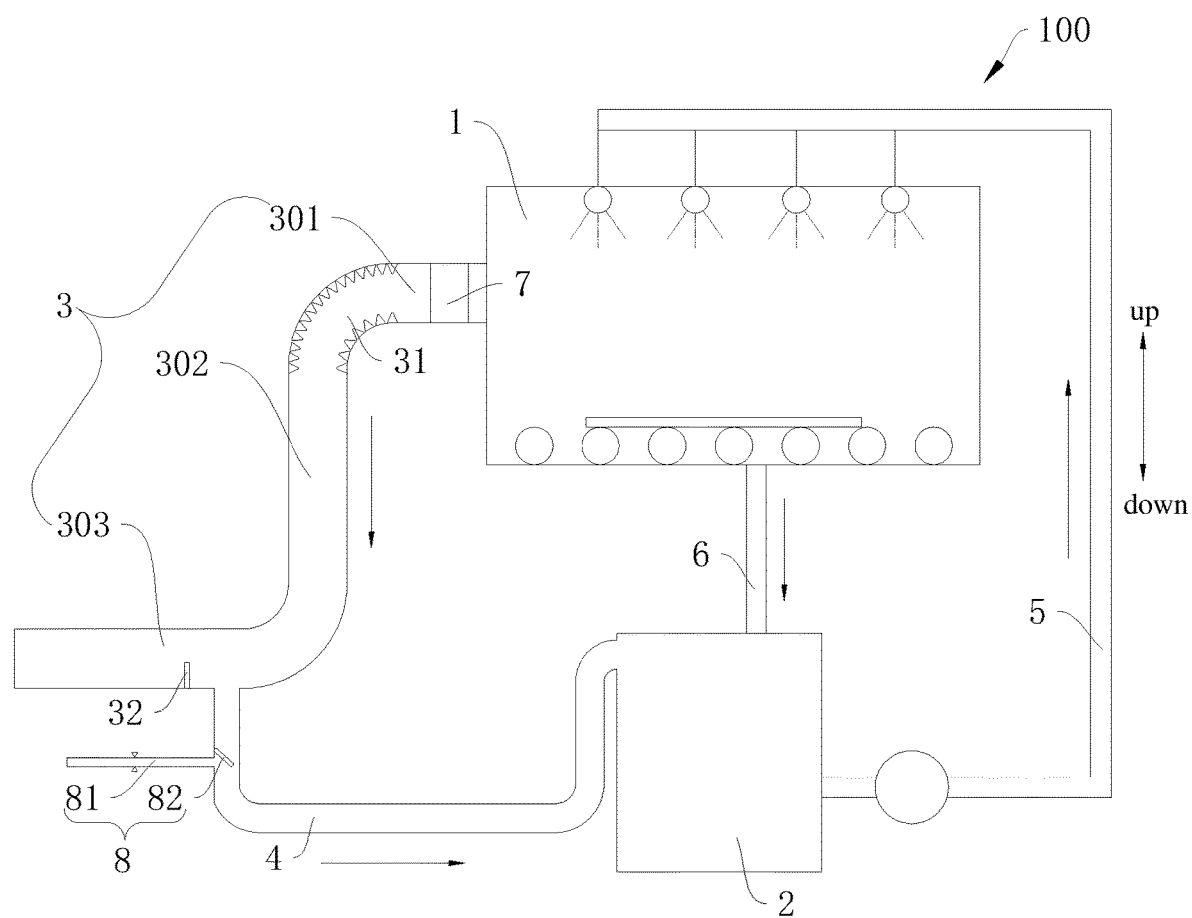

LIQUID CHEMICAL VAPOR RECOVERY DEVICE, WET STRIPPING DEVICE, PHOTORESIST STRIPPING PROCESS, AND METHOD FOR MANUFACTURING THIN FILM TRANSISTOR-LIQUID CRYSTAL DISPLAY USING THE SAME

CROSS REFERENCE TO RELATED APPLICATION

The present application claims a priority benefit of Chinese Patent Application No. 201721086482.2, filed on Aug. 25, 2017, the entire contents thereof being incorporated herein by reference.

TECHNICAL FIELD

The present disclosure relates to the technical field of display panel manufacture, and particularly to a liquid chemical vapor recovery technology in wet processing.

BACKGROUND

In the manufacture process of thin film transistor-liquid crystal displays (TFT-LCDs), a stripping process is used to remove a photoresist (PR) used for protecting a pattern in the manufacture procedure. Because the temperature in the stripping process is typically 60° C. or higher, and the stripping liquid per se has an organic property and is volatile, there will be a great liquid chemical volatilization loss in the manufacture procedure.

SUMMARY

The present disclosure provides a liquid chemical vapor recovery device, a wet stripping device, a photoresist stripping process, and a method for manufacturing a thin film transistor-liquid crystal display using the same.

The liquid chemical vapor recovery device according to an embodiment of the present disclosure comprises:

an exhaust pipe for discharging a gas in a processing chamber for wet processing with a liquid chemical, the gas comprising a vapor of the liquid chemical; and a reflux pipe for refluxing the liquid chemical condensed in the exhaust pipe to a liquid chemical storage tank, the reflux pipe having an inlet connected to the exhaust pipe and an outlet connected to the liquid chemical storage tank, wherein, at least a part of the exhaust pipe positioned upstream of the inlet of the reflux pipe is formed as a pipe segment with a rugged inner surface.

In one embodiment of the present disclosure, an internal thread structure is formed on the inner surface of the pipe segment.

In one embodiment of the present disclosure, a cooling element is provided on the exhaust pipe, and at least a part of the cooling element is positioned upstream of the inlet of the reflux pipe.

In one embodiment of the present disclosure, at least a part of the cooling element is disposed within the exhaust pipe.

In one embodiment of the present disclosure, at least a part of the cooling element is to disposed upstream of the pipe segment.

In one embodiment of the present disclosure, the cooling element comprises a pipeline set for process cooling water.

In one embodiment of the present disclosure, a block is provided on an inner wall of the exhaust pipe at a position downstream of the inlet of the reflux pipe.

In one embodiment of the present disclosure, the exhaust pipe comprises a first horizontal section, a vertical section and a second horizontal section, the first horizontal section being connected to the processing chamber; an upper end of the vertical section being connected to the first horizontal section; and the second horizontal section being connected to a lower end of the vertical section; wherein, the inlet of the reflux pipe is connected to the second horizontal section of the exhaust pipe.

In one embodiment of the present disclosure, at least a part of the pipe segment is positioned at the first horizontal section.

In one embodiment of the present disclosure, the reflux pipe is connected with a gas blowing system for blowing into the reflux pipe a gas flow toward the liquid chemical storage tank.

In one embodiment of the present disclosure, the gas blowing system is adjacent to the inlet of the reflux pipe.

In one embodiment of the present disclosure, the gas blowing system comprises a gas feed pipe and a valve. The gas feed pipe is connected to the reflux pipe; and the valve is disposed on the reflux pipe, which blocks a part of the reflux pipe positioned upstream of an outlet of the gas blowing system when the gas blowing system blows a gas.

In one embodiment of the present disclosure, the valve is a gas floating baffle disposed within the reflux pipe and positioned at an outlet of the gas feed pipe.

In one embodiment of the present disclosure, the reflux pipe is a U-shaped pipe.

The wet stripping device according to an embodiment of the present disclosure comprises:

a stripping chamber;

a liquid chemical storage tank;

a chemical supply system for supplying a liquid chemical from the liquid chemical storage tank to the stripping chamber; and the liquid chemical vapor recovery device described above, wherein the liquid chemical vapor recovery device is connected between the stripping chamber and the liquid chemical storage tank.

In one embodiment of the present disclosure, the wet stripping device further comprises a self-reflux system for self-refluxing the liquid chemical to the liquid chemical storage tank.

In one embodiment of the present disclosure, the liquid chemical storage tank is disposed below the stripping chamber, and the self-reflux system comprises a straight pipe having an upper end connected to a bottom of the stripping chamber and a lower end connected to a top of the liquid chemical storage tank.

The photoresist stripping process according to an embodiment of the present disclosure comprises wet stripping a photoresist by using the wet stripping device described above.

In one embodiment of the present disclosure, the photoresist is a photoresist for protecting a pattern on a glass substrate.

The method for manufacturing a thin film transistor-liquid crystal display according to an embodiment of the present disclosure comprises a manufacture procedure of a thin film transistor, wherein the manufacture procedure of a thin film transistor comprises a step of stripping a photoresist by using the process described above.

BRIEF DESCRIPTION OF DRAWINGS

FIG. 1 is a schematic diagram of a wet stripping device according to one embodiment of the present disclosure.

DETAILED DESCRIPTION

With the maturity of TFT-LCD technology in 1990s, liquid crystal display panels develop rapidly due to its advantages in overall properties such as luminance, contrast, energy consumption, lifetime, volume, weight and the like.

Recently, TFT-LCDs develop rapidly towards large dimension and high resolution. How to control the production cost better becomes a top priority considered by all companies. In the TFT manufacture process, because a large amount of chemicals are consumed in a wet process, fees for bill of material (BOM) remain high continuously. It is true especially for a stripping process. The stripping process is utilized to remove a photoresist (PR) adhesive for protecting a pattern in the manufacture procedure. The process temperature is high, for example, about 60° C. The process pressure is high, and the high pressure range may be up to 0.9 MPa. Due to the volatilization property of the liquid chemical, the amount of the liquid chemical carried over on each glass substrate (G8.5 (generation 8.5) standard) in practical production may be up to around 0.6 L, cost of which is about 6 yuan (RMB). For a plant capacity of 120K standard, the estimated cost of stripping liquid loss due to liquid chemical carrying over in each month is about 3.5 million yuan!

In related technologies, an exhaust pipeline of a stripping equipment is provided with a conventional block to allow an exhaust vapor to be condensed, and the condensate is then refluxed to a liquid chemical storage tank through a curved gas pipe without any auxiliary. This solution has a poor condensation effect, as only a very few part of the exhaust vapor from a processing chamber will be condensed and retained in the curved gas pipe. Further, due to the internal pressure of the liquid chemical storage tank, it is difficult for the condensed liquid chemical to be returned to the liquid chemical storage tank in time and reused sufficiently. The long residence time of the condensed liquid chemical in the gas pipe may also be a problem, because the retained liquid chemical is prone to cause the corrosion of the pipeline joint, resulting in the occurrence of severe accidents such as liquid leakage and the like. From a view of the recycle of liquid chemical and safety, in combination with the G8.5 production practice, there is an urgent need for a device which can automatically recycle liquid chemical more efficiently.

In order to solve some problems in the related art, the present disclosure designs a liquid chemical vapor recovery device, which has a more efficient exhaust gas condensation effect, significantly reduces the liquid chemical waste due to volatilization and gas exhausting, and saves the production cost.

The embodiments of the present disclosure will be described in detail below. The examples of the embodiments are shown in the drawings, throughout which identical or similar reference numbers indicate identical or similar elements or elements having identical or similar functions. The embodiments described below with reference to the drawings are exemplary, and are intended to illustrate the present disclosure, but cannot be understood to limit the present disclosure.

As shown in FIG. 1, the wet stripping device 100 according to one embodiment of the present disclosure comprises a stripping chamber 1, a liquid chemical storage tank 2, an exhaust pipe 3, and a reflux pipe 4, wherein the exhaust pipe 3 and the reflux pipe 4 constitute a liquid chemical vapor recovery device according to one embodiment of the present disclosure.

The exhaust pipe 3 is in fluid communication with the stripping chamber 1, so it can be utilized for discharging gas(es) in the stripping chamber 1 during a stripping process. Because the liquid chemical will volatilize in the stripping process, a part of the liquid chemical will be discharged along the exhaust pipe 3. In order to facilitate the collection of the liquid chemical in the gas flow, the present disclosure provides a reflux pipe 4 for the recovery and reuse of the liquid chemical in the exhaust pipe 3, an inlet of the reflux pipe 4 being connected to the exhaust pipe 3 and an outlet of the reflux pipe 4 being connected to the liquid chemical storage tank 2, to reflux the liquid chemical in the exhaust pipe 3 to the liquid chemical storage tank 2.

At least a part of the exhaust pipe 3 positioned upstream of the inlet of the reflux pipe 4 is formed as a pipe segment 31 with a rugged inner surface. In a gas exhausting process, the liquid chemical will pass through the rugged pipe segment 31 of the exhaust pipe 3. During the passage of the gas flow, the rugged pipe segment 31 can have a condensation function, such that the liquid chemical in the gas flow is adsorbed on this pipe segment 31, thereby facilitating the collection of the liquid chemical.

In the wet stripping device 100 according to the embodiment of the present disclosure, because the exhaust pipe 3 is provided with the pipe segment 31 with a rugged inner surface, the adhesion to the inner surface of the exhaust pipe 3 is increased, such that more liquid chemical may be adhered to the inner surface of the exhaust pipe 3, thereby improving the recovery rate of the liquid chemical. And the rugged inner surface has less influence on the passage of the gas flow, facilitating the improvement in stripping efficiency.

In an embodiment of the present disclosure, an internal thread structure is formed on the inner surface of the pipe segment 31. That is, the aforementioned rugged inner surface is in a form of internal thread. In this manner, it not only facilitates the condensation of the liquid chemical, but also has a spiral directing effect on the gas flow passing through the pipe segment 31, such that the liquid chemical in the gas flow can be rapidly separated under the centrifugation effect caused by the spiral flow, further improving the rate and efficiency of the liquid chemical recovery.

The pipe segment 31 may be disposed adjacent to the stripping chamber 1 to further facilitate the recovery of the liquid chemical. Because the inner space of the stripping chamber 1 is larger than that of the exhaust pipe 3, there is generally a turbulence problem when the gas flow entering into the exhaust pipe 3 from the stripping chamber 1. At this time, the gas flow entering into the exhaust pipe 3 is unstable. When the gas flow passes through the pipe segment 31, there are more opportunities for the gas flow to contact with the rugged inner surface so as to achieve the condensation effect, which thus further improves the rate and efficiency of the liquid chemical recovery.

A condensing element may also be disposed on the exhaust pipe 3. The condensing element may be an element for adsorbing the liquid chemical disposed within the exhaust pipe 3, or an element for cooling the gas flow. Here, the main reason why the gas flow carries the liquid chemical is the volatilization of the liquid chemical. Cooling the gas flow can decrease the temperature of the gas flow to reduce the liquid chemical content in the gas flow and to condense the liquid chemical in the gas flow, further improving the recovery rate of the liquid chemical.

As shown in FIG. 1, in one embodiment of the present disclosure, a cooling element 7 is provided on the exhaust pipe 3, and at least a part of the cooling element 7 is positioned upstream of the inlet of the reflux pipe 4. That is, the gas flow is cooled before it passes through the inlet of the reflux pipe 4, which facilitates adhering the liquid chemical to the inner surface of the exhaust pipe 3 and refluxing it to the liquid chemical storage tank 2 via the reflux pipe 4.

At least a part of the cooling element 7 may be disposed within the exhaust pipe 3. The cooling element 7 disposed in within the exhaust pipe 3 can directly condense the chemical in the gas flow, that is, when the gas flow passes through the cooling element 7, the liquid chemical volatilized into the gas flow will be condensed on the surface of the cooling element 7 because of the relatively low temperature of the cooling element 7. As such, the cooling efficiency and recovery rate of the liquid chemical can be improved.

Of course, the cooling element 7 may also be disposed outside of the wall of the exhaust pipe 3 and so on, and it can rapidly condense and recover the liquid chemical as well.

Further, at least a part of the cooling element 7 may be disposed upstream of the pipe segment 31. After cooling, the liquid chemical in the gas flow is more conveniently adhered to the pipe segment 31 with a rugged inner surface, further facilitating the condensation and recovery of the liquid chemical.

The cooling element 7 may also be disposed on the pipe segment 31, or downstream of the pipe segment 31, and the condensation efficiency and recovery effect of the liquid chemical can be improved as well.

In one embodiment of the present disclosure, a pipeline set for process cooling water (PCW pipeline set) may be used as the cooling element 7. In comparison with an ordinary filler, the temperature reduction effect of the PCW pipeline set is more significant, which thus improves the condensation effect.

As shown in FIG. 1, in one embodiment of the present disclosure, a block 32 is provided on an inner wall of the exhaust pipe 3 at a position downstream of the inlet of the reflux pipe 4. The liquid chemical entrained in the gas flow can be condensed with the blocking effect of the block 32, and the condensed liquid chemical can flow into the inlet of the reflux pipe 4 in time due to the blocking effect of the block 32, thereby facilitating the recovery of the liquid chemical.

The block 32 may be configured to have an upper edge higher than the inlet of the reflux pipe 4. The block 32 may be a protuberance.

As shown in FIG. 1, in one embodiment of the present disclosure, the exhaust pipe 3 comprises a first horizontal section 301, a vertical section 302 and a second horizontal section 303. The first horizontal section 301 is connected to the stripping chamber 1, an upper end of the vertical section 302 is connected to the first horizontal section 301, and the second horizontal section 303 is connected to a lower end of the vertical section 302, wherein, the inlet of the exhaust pipe 4 is connected to the second horizontal section 303 of the exhaust pipe 3. That is, the gas flow discharged from the stripping chamber 1 first passes through the first horizontal section 301, then into the vertical section 302, then into the second horizontal section 303, and into the reflux pipe 4 at the second horizontal section 303. Here, disposing the first horizontal section 301 can facilitate the connection of the exhaust pipe 3 and the stripping chamber 1; disposing the vertical section 302 can facilitate the reflux of the gas flow and the condensed liquid chemical under the action of gravity, improving the recovery rate of the liquid chemical; and the second horizontal section 303 can facilitate collecting the condensed liquid chemical and entering into the reflux pipe 4.

At least a part of the pipe segment 31 may be disposed in the first horizontal section 301, or at the joint of the first horizontal section 301 and the vertical section 302.

In the wet stripping device 100 according to the embodiment of the present disclosure, the reflux pipe 4 is used to reflux the liquid chemical to the liquid chemical storage tank 2 rapidly, improving the recovery rate of the liquid chemical. The inlet of the reflux pipe may be disposed not lower than the outlet of the reflux pipe. In this manner, the liquid chemical entered the reflux pipe 4 via the inlet of the reflux pipe may be refluxed to the liquid chemical storage tank 2 via the outlet of the reflux pipe under the action of gravity.

As shown in FIG. 1, in one embodiment of the present disclosure, the reflux pipe 4 is connected with a gas blowing system 8 for blowing into the reflux pipe 4 a gas flow towards the liquid chemical storage tank 2. During use, a gas is blown to the liquid chemical in the reflux pipe 4 by the gas blowing system 8. At this time, under the action of gas pressure, the liquid chemical in the reflux pipe 4 will be refluxed to the liquid chemical storage tank 2 rapidly, improving the recovery rate of the liquid chemical. Here, the gas flow blown by the gas blowing system 8 may be a clean and dry compressed air (CDA).

The gas blowing system 8 may be disposed adjacent to the inlet of the reflux pipe 4, facilitating blowing the liquid chemical in the reflux pipe 4 to the liquid chemical storage tank 2.

As shown in FIG. 1, the gas blowing system 8 comprises a gas feed pipe 81 and a valve 82. The gas feed pipe 81 is connected to the reflux pipe 4; the valve 82 is disposed on the reflux pipe 4, and blocks a part of the reflux pipe positioned upstream of an outlet of the gas blowing system 8 when the gas blowing system 8 blows a gas. That is, when a gas is blown through the gas feed pipe 81, the valve 82 blocks the reflux pipe upstream of the reflux pipe 4. At this time, the gas is blown to the liquid chemical storage tank 2 along the reflux pipe 4, without influencing the operation of the exhaust pipe 3, and the gas flow is concentrated, facilitating the rapid recovery of the liquid chemical.

In one embodiment of the present disclosure, the valve 82 is a gas floating baffle disposed within the reflux pipe 4 and positioned at an outlet of the gas feed pipe 81. That is, the valve 82 is driven directly by the gas flow in the gas feed pipe 81. When a gas is fed through the gas feed pipe 81, the gas flow is transported to the reflux pipe 4, and at this time, the valve 82 is opened under the action of the gas flow. When no gas is fed through the gas feed pipe 81, the valve 82 is closed.

The gas blowing system 8 disposed as above can not only improve the recovery efficiency of the liquid chemical, but also prevent the liquid chemical from entering into the gas feed pipe 81, by closing the outlet of the gas feed pipe 81 with the valve 82 when the gas blowing system 8 is not required to be operated. As such, the recovery efficiency of the liquid chemical is further improved.

As shown in FIG. 1, in one embodiment of the present disclosure, the reflux pipe 4 is a U-shaped pipe. Particularly, the reflux pipe 4 is a U-shaped pipe with upward openings. In this manner, a vertical pipe section connected to the exhaust pipe 3 can facilitate the reflux of the condensed liquid chemical, a vertical pipe section connected to the liquid chemical storage tank 2 extends upwards and can facilitate connecting to the liquid chemical storage tank 2, and the U-shaped reflux pipe 4 reduces the space occupancy of the whole system.

The reason why the aforementioned U-shaped reflux pipe can reduce the space occupancy is that if an L-shaped pipe (that is, a vertical section is connected to the exhaust pipe 3, and a horizontal section is connected to the liquid chemical storage tank 2) is used, at this time, the liquid chemical storage tank 2 has to be lowered (compared to that shown in FIG. 1), to fit with the reflux pipe 4, such that the space occupancy is relatively high.

As shown in FIG. 1, the wet stripping device 100 according to the embodiment of the present disclosure further comprises a chemical supply system 5 and a self-reflux system 6, which are disposed to respectively connect the liquid chemical storage tank 2 and the stripping chamber 1. The chemical supply system 5 supplies the liquid chemical from the liquid chemical storage tank 2 to the stripping chamber 1 for stripping process, and the self-reflux system 6 allows the liquid chemical after the stripping processing to be refluxed therethrough. As such, it enables the implementation of stripping procedure and improves the recovery efficiency of the liquid chemical.

In one embodiment of the present disclosure, the liquid chemical storage tank 2 is disposed below the stripping chamber 1, the chemical supply system 5 comprises a liquid pump connected to the liquid chemical storage tank 2 and the stripping chamber 1 respectively, and the self-reflux system 6 comprises a straight pipe an upper end of which is connected to a bottom of the stripping chamber 1 and a lower end of which is connected to a top of the liquid chemical storage tank 2.

The embodiments of the present disclosure can bring about at least one of the following advantageous effects:

as at least a part of the exhaust pipe has a rugged inner surface (for example, an internal thread design), it can effectively increase the contact area of the vapor and the inner wall of the exhaust pipe, achieving a better condensation and recovery;

as a cooling element is disposed on the exhaust pipe, and cooperated with the pipe segment with a rugged inner surface, the condensation effect is improved greatly; when a PCW pipeline set is used as the cooling element, the condensation effect is further improved;

as a block is provided in the exhaust pipe at a position downstream of the inlet of the reflux pipe, the condensed liquid chemical is effectively throttled, and enters into the reflux pipe; and as a gas blowing system (for example, CDA pipeline), which can automatically open and close the gas path of blowing gas, is connected to the reflux pipe, the condensed liquid chemical can be returned to the liquid chemical storage tank as soon as possible under the external force of the blowing gas, thereby the production cost is saved while the problems of the corrosion of the pipeline joint caused by the liquid chemical deposited therein and the like can be avoid.

By using the liquid chemical vapor recovery device of the present disclosure, the amount of the liquid chemical carried over on a current B5 single sheet can be reduced from 0.6 L/SH to 0.55 L/SH, and about 0.5 yuan per time in the production cost for each single sheet can be saved. Calculated according to the 120K capacity standard, about 200 thousands yuan of cost reduction can be achieved every month. In an optimum configuration, it is estimated that the amount of the liquid chemical carried over on a single sheet can be reduced to 0.40 L/SH, further reducing the production cost.

In the description of the present disclosure, it should be understood that direction or position relationship indicated by the term "center", "longitudinal", "transverse", "length", "width", "thickness", "above", "below", "front", "back", "left", "right", "vertical", "horizontal", "top", "bottom", "in", "out", "clockwise", "anti-clockwise", "axial", "radial", "circumferential" or the like is described on the basis of the direction or position relationship shown in figure(s), and it is only for the purpose of describing the present disclosure conveniently and simplifying the description, but it does not indicate or imply that the referred device or member must have a particular direction or position, or be constructed or operated in a particular direction or position. As a result, it should not be interpreted as limiting the present disclosure.

Furthermore, the term "first" or "second" is only used for description purpose, but cannot be understood to indicate or suggest the relative importance or to imply the amount of the indicated technical feature. Therefore, the feature defined with "first" or "second" may explicitly or implicitly comprise at least one of this feature. In the description of the present disclosure, unless specifically and particularly defined otherwise, "a plurality of" refers to at least two, for example, two, three, and so on.

In the present disclosure, unless specifically specified and defined otherwise, term "installing", "connecting", "linking", "mounting" or the like should be broadly interpreted, for example, it can be fixedly connecting, detachably connecting, or integrating; it can be mechanical connection or electric connection; and it can be directly connecting, connecting via an intermediate, or connecting inside two members or interaction between two members, unless specifically defined otherwise. Those skilled in the art can understand the particular meanings of the above terms in the present disclosure according to particular circumstances.

In the present disclosure, unless specifically specified and defined otherwise, the expression that the first feature is "above" or "below" the second feature may mean that the first feature is directly contacted with the second feature, or the first and second features are indirectly contacted with each other through an intermediate. And, the expression that the first feature is "on", "above" and "on top of" the second feature may mean that the first feature is right above or obliquely above the second feature, or only mean that the horizontal height of the first feature is higher than that of the second feature. The expression that the first feature is "under", "below" and "beneath" the second feature may mean that the first feature is right below or obliquely below the second feature, or only mean that the horizontal height of the first feature is lower than that of the second feature.

In the description of this specification, the description with reference to term "an embodiment", "some embodiments", "example", "particular example", "some examples", or the like means that the particular feature, structure, material or characteristic described with reference to the embodiment or example is included in at least one embodiment or example of the present disclosure. In this specification, the exemplary expressions of the above terms are not required to refer to the same embodiment or example. And the particular feature, structure, material or characteristic described can be combined in a suitable manner in one or more embodiments or examples. Further, without contradicting with each other, different embodiments or examples as well as the features of different embodiments or examples described in this specification can be combined by those skilled in the art.

Although the embodiments of the present disclosure have been shown and described above, it should be understood that the above embodiments are exemplary, and should not be construed as limiting the present disclosure. A person of ordinary skills in the art can make change, modification, replacement and variation on the above embodiments within the scope of the present disclosure.

What is claimed is:

1. A wet stripping device comprising:
    a stripping chamber;
    a liquid chemical storage tank;
    a chemical supply system for supplying a liquid chemical from the liquid chemical storage tank to the stripping chamber;
    a self-reflux system for self-refluxing the liquid chemical in the stripping chamber to the liquid chemical storage tank; and
    a liquid chemical vapor recovery device connected between the stripping chamber and the liquid chemical storage tank, the liquid chemical vapor recovery device comprising:
    an exhaust pipe for discharging a gas in the stripping chamber, the gas comprising a vapor of the liquid chemical, wherein the exhaust pipe comprises:
        a first horizontal section and a second horizontal section connected by a vertical section, wherein
        the first horizontal section is connected to the stripping chamber;
        an upper end of the vertical section is connected to the first horizontal section; and
        the second horizontal section is connected to a lower end of the vertical section such that a gas flow discharged from the stripping chamber first passes through the first horizontal section, then into the vertical section, then into the second horizontal section;
    a reflux pipe for refluxing liquid chemical condensed in the exhaust pipe to the liquid chemical storage tank, the reflux pipe having an inlet connected to the second horizontal section of the exhaust pipe and an outlet connected to the liquid chemical storage tank; and
    a block provided on an inner wall of the second horizontal section of the exhaust pipe and located at a position downstream of the inlet of the reflux pipe, said block being a protuberance protruding from the inner wall of the exhaust pipe toward the interior of the exhaust pipe, wherein, at least a part of the exhaust pipe positioned upstream of the inlet of the reflux pipe is formed as a pipe segment with a rugged inner surface.

2. The wet stripping device according to claim 1, wherein, an internal thread structure is formed on the inner surface of the pipe segment.

3. The wet stripping device according to claim 1, wherein, a cooling element is provided on the exhaust pipe, and at least a part of the cooling element is positioned upstream of the inlet of the reflux pipe.

4. The wet stripping device according to claim 3, wherein, at least a part of the cooling element is disposed within the exhaust pipe.

5. The wet stripping device according to claim 3, wherein, at least a part of the cooling element is disposed upstream of the pipe segment.

6. The wet stripping device according to claim 3, wherein, the cooling element comprises a pipeline set for process cooling water.

7. The wet stripping device according to claim 1, wherein, at least a part of the pipe segment is positioned at the first horizontal section.

8. The wet stripping device according to claim 1, wherein, the reflux pipe is connected with a gas blowing system for blowing into the reflux pipe a gas flow toward the liquid chemical storage tank.

9. The wet stripping device according to claim 8, wherein, the gas blowing system is adjacent to the inlet of the reflux pipe.

10. The wet stripping device according to claim 8, wherein, the gas blowing system comprises:
    a gas feed pipe connected to the reflux pipe; and
    a valve disposed on the reflux pipe, which blocks a part of the reflux pipe positioned upstream of an outlet of the gas blowing system when the gas blowing system blows a gas.

11. The wet stripping device according to claim 10, wherein, the valve is a gas floating baffle disposed within the reflux pipe and positioned at an outlet of the gas feed pipe.

12. The wet stripping device according to claim 1, wherein, the reflux pipe is a U-shaped pipe.

13. The wet stripping device according to claim 1, wherein, the liquid chemical storage tank is disposed below the stripping chamber, and the self-reflux system comprises a straight pipe having an upper end connected to a bottom of the stripping chamber and a lower end connected to a top of the liquid chemical storage tank.

* * * * *